US008958248B2

(12) United States Patent
van Duuren et al.

(10) Patent No.: US 8,958,248 B2
(45) Date of Patent: Feb. 17, 2015

(54) 2T AND FLASH MEMORY ARRAY

(71) Applicant: NXP B.V., Eindhoven (NL)

(72) Inventors: Michiel Jos van Duuren, Valkenswaard (NL); Maurits Mario Nicolaas Storms, Best (NL); Erik Maria van Bussel, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/827,880

(22) Filed: Mar. 14, 2013

(65) Prior Publication Data

US 2014/0269075 A1    Sep. 18, 2014

(51) Int. Cl.
  *G11C 16/04*    (2006.01)
  *G11C 16/10*    (2006.01)
  *G11C 11/56*    (2006.01)

(52) U.S. Cl.
  CPC ............ *G11C 16/10* (2013.01); *G11C 11/5621* (2013.01); *G11C 16/0433* (2013.01); *G11C 16/0483* (2013.01)
  USPC .................... 365/185.17; 365/185.18; 365/63

(58) Field of Classification Search
  USPC ............... 365/185.17–185.18, 51, 63, 185.33
  See application file for complete search history.

(56) References Cited

U.S. PATENT DOCUMENTS

| 5,844,270 | A  |   | 12/1998 | Kim et al. |            |
|-----------|----|---|---------|------------|------------|
| 5,912,842 | A  | * | 6/1999  | Chang et al. | 365/185.11 |
| 8,233,320 | B2 | * | 7/2012  | Lee et al. | 365/185.03 |
| 8,693,248 | B2 | * | 4/2014  | Kwon       | 365/185.11 |

OTHER PUBLICATIONS

Scarpa, A. et al. "Reliability Implications in Advanced Embedded Two-Transistor-Fowler-Nordheim-NOR Flash Memory Devices", Solid-State Electronics, Elsevier Science Publishers, vol. 46, No. 11, pp. 1765-1773 (Nov. 1, 2002).
Extended European Search Report for Patent Appln. No. 14157024.2 (Nov. 12, 2014).

* cited by examiner

*Primary Examiner* — David Lam

(57) ABSTRACT

Flash memory arrays are described. In one embodiment, a flash memory array includes memory sectors of Two-Transistor (2T) AND memory cells. Within each of the memory sectors, a row of sector selection transistors is configured such that writing data onto a memory column within the memory sector is controlled by applying a voltage to a bit line, independent from the row of sector selection transistors. Other embodiments are also described.

20 Claims, 5 Drawing Sheets

2T AND FLASH MEMORY ARRAY

Embodiments of the invention relate generally to electronic systems and methods and, more particularly, to flash memory arrays.

Flash memory is a type of non-volatile storage element that can be electrically erased and reprogrammed. Flash memory can be used in a computing device, such as a smartphone, a tablet computer, a laptop, etc, or an integrated circuit (IC) card, such as a smart card. A Two-Transistor (2T) flash memory array includes a number of flash memory cells that includes two transistors in each memory cell. Generally, programming a 2T flash memory array, i.e., writing data to the memory array, requires selecting a specific segment of the memory array through applying precise voltages to voltage driver circuits of the memory array. However, the requirement of driving the flash memory array using precise voltages reduces the reliability of the memory array and increases the complexity of the driver circuits. For example, during a write operation of a traditional 2T flash memory array, a sufficiently high voltage must be applied to memory selection devices to ensure the connection between corresponding local and global voltage lines. However, applying a high voltage to selection devices can compromise the integrity of the gate oxide of the selection devices and increase the complexity and size of driver circuits for the selection devices. Thus, there is a need for a flash memory array that allows memory segment selection in a reliable manner while reducing the complexity of the corresponding driver circuits.

Flash memory arrays are described. In one embodiment, a flash memory array includes memory sectors of Two-Transistor (2T) AND memory cells. Within each of the memory sectors, a row of sector selection transistors is configured such that writing data onto a memory column within the memory sector is controlled by applying a voltage to a bit line, independent from the row of sector selection transistors. Other embodiments are also described.

In an embodiment, a flash memory array includes memory sectors of 2T AND memory cells. Within each of the memory sectors, a row of sector selection transistors is configured such that writing data onto a memory column within the memory sector is controlled by applying a voltage to a bit line, independent from the row of sector selection transistors.

In an embodiment, a 2T AND flash memory array includes rows of storage transistors configured to store memory values, rows of access transistors configured to access the rows of storage transistors, and a row of sector selection transistors used to select the rows of access transistors and the rows of storage transistors. The row of sector selection transistors is located adjacent to the one of the rows of access transistors such that the one of the rows of access transistors is located between the row of sector selection transistors and one of the rows of storage transistors.

In an embodiment, a flash memory array includes memory sectors of 2T AND memory cells. Each of the memory sectors comprises memory rows of 2T AND memory cells and a row of sector selection transistors connected to the memory rows and used to select the memory rows. Each of the memory rows comprises a plurality of 2T AND memory cells. Each 2T AND memory cell includes a storage transistor configured to store a memory value and an access transistor configured to access the storage transistor. Within each of the memory sectors, a respective row of sector selection transistors is located adjacent to the access transistors of a row of 2T AND memory cells of the memory sector such that the access transistors of the row of 2T AND memory cells are located between the respective row of sector selection transistors and storage transistors of the respective row of sector selection transistors.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
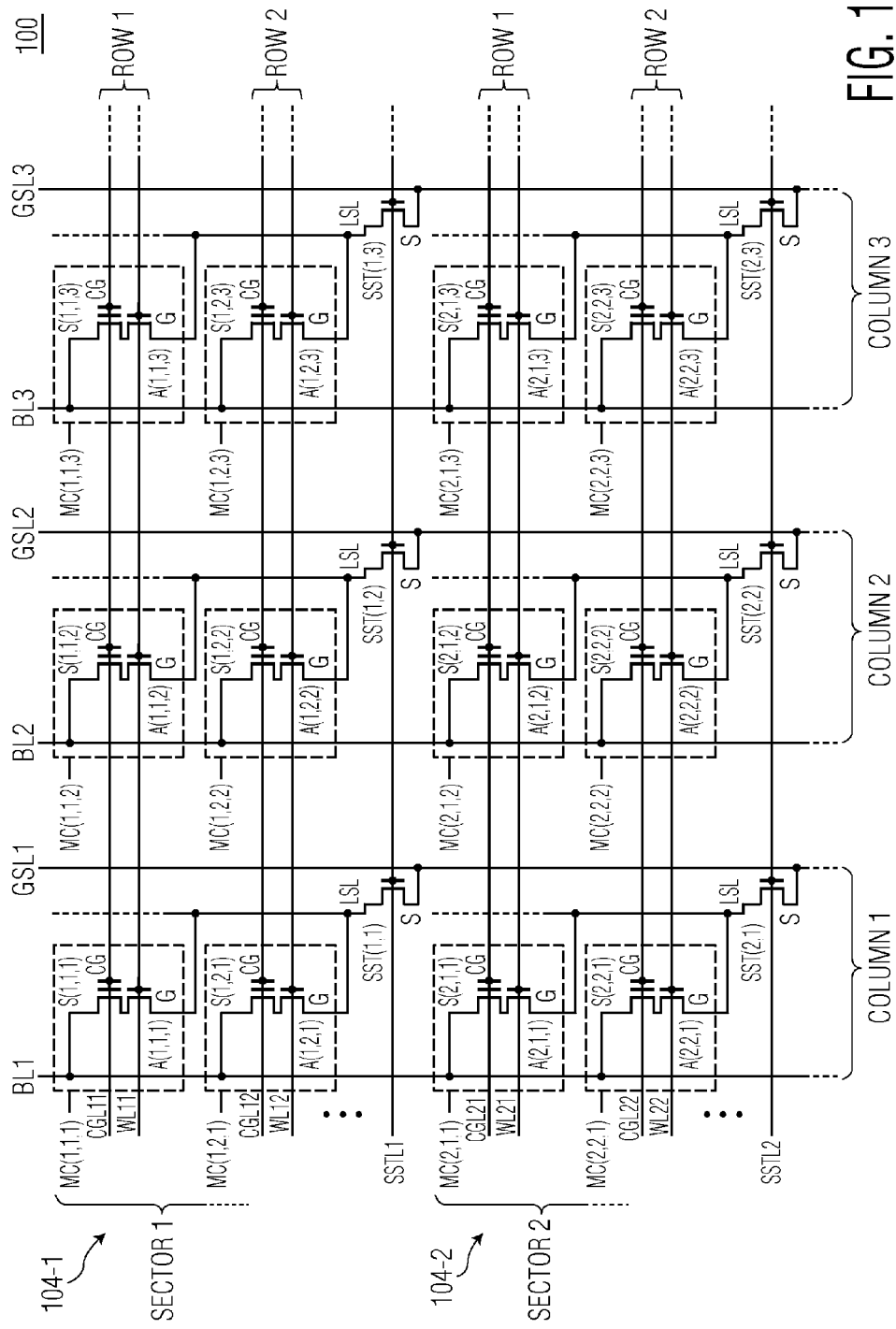
FIG. 1 is a schematic block diagram of a memory array in accordance with an embodiment of the invention.

FIG. 1 is a schematic block diagram of a memory array 100 in accordance with an embodiment of the invention. The memory array can be used for embedded memories as well as for standalone memories. For example, the memory array may be used in a microcontroller or in an automotive IC chip. In an embodiment, the memory array is implemented as an Integrated Circuit (IC), which may be a part of a computing device, such as a smartphone, a tablet computer, a laptop, etc, or an IC card, such as a smart card.

In the embodiment depicted in FIG. 1, the memory array 100 is a Two-Transistor (2T) AND memory array that is divided into a number of memory sectors 104-1, 104-2. Each memory sector includes rows and columns of 2T AND memory cells (MC), MC(1,1,1) . . . MC(2,2,3), and at least one row of sector selection transistors (SSTs), SST(1,1) . . . SST(2,3). MC(X,Y,Z) represents a memory cell that is located in memory sector, "X," memory row, "Y," within the memory sector, and memory column, "Z," within the memory array, where X, Y, Z are positive integers. For example, memory row 1 of the memory sector 104-1 includes memory cells, MC(1,1,1), MC(1,1,2), MC(1,1,3), while row 2 of the memory sector includes memory cells, MC(1,2,1), MC(1,2,2), MC(1,2,3). In some embodiments, the number of memory columns and rows within the memory sectors differs from one memory sector to another. Although the memory array 100 is shown in FIG. 1 as including two memory sectors, typically, the memory array will include more than two memory sectors. In addition, although the memory sectors, 104-1, 104-2, are shown in FIG. 1 as including two rows and three columns of memory cells, typically, the memory sectors will include more rows and columns of memory cells. In some embodiments, the memory array includes hundreds of memory sectors and each memory sector includes hundreds of rows and hundreds of columns of memory cells. For example, a 16 megabit (Mb) memory array may include 64 memory sectors and each memory sector may include 64 rows and 4096 columns of 2T AND memory cells.

In the embodiment depicted in FIG. 1, each of AND memory cells, MC(1,1,1) . . . MC(2,2,3), is connected to a word line, WL11, WL12, WL21, or WL22, and a bit line, BL1, BL2, or BL3. Within each of the memory sectors, 104-1, 104-2, the number of rows of 2T AND memory cells is the same as the number of word lines, e.g., WL11, WL12, WL21, WL22. It is possible that the number of rows and columns in each memory sector is different from sector to sector. In some embodiments, the number of word lines can vary from one memory sector to another memory sector. The number of memory cells in each row, which is the same as the number of memory cell columns, matches the number of the bit lines, BL1, BL2, BL3. Within each AND memory sector, global source lines (GSLs), GSL1, GSL, GSL3, and sector selector transistor voltage lines (SSTLs), SSTL1, SSTL2, are connected to the sector selection transistors, SST(1,1) . . . SST(2,3). The number of the bit lines and the global source lines matches the number of memory columns and the number of word lines in each memory sector matches the number of memory rows in the memory sector. An "AND" array architecture configuration refers to an array architecture where the global source lines and the bit lines run in the same direction and perpendicular to the word lines, as opposed to an "NOR" architecture, where the global source lines run parallel to the word lines and perpendicular to the bit lines.

The sector selection transistors, SST(1,1) . . . SST(2,3), which can also be referred to as sector selection gates, are used to select one or more memory cells from a respective memory sector. Within each memory sector, e.g., 104-1 or 104-2, the row of sector selection transistors, SST(1,1) . . . SST(2,3), is configured such that writing data onto a memory column within the memory sector is controlled by applying a voltage to a corresponding bit line, independent from the row of sector selection transistors. For example, writing data onto memory column 1, 2, or 3 within the memory sector 104-1 is controlled by applying a voltage to a corresponding bit line, BL1, BL2, BL3, independent from the row of sector selection transistors, SST(1,1), SST(1,2), SST(1,3). Consequently, the voltage applied to the row of sector selection transistors can be set within a flexible range. Because the voltage applied to the sector selection transistors is not required to be fixed at a constantly high level, the integrity of the gate oxide of the selection devices is improved and the complexity and size of driver circuits for the selection devices is reduced. Therefore, the memory segment selection can be performed in a reliable, cost-efficient manner.

In the embodiment depicted in FIG. 1, the sector selection transistors, SST(1, 1) . . . SST(2,3), isolate or connect local source lines (LSLs) to the global source lines, GSL1, GSL2, GSL3. A local source line can be connected to a corresponding global source line by more than one sector selection transistor. For instance, a local source line can be connected to one sector selection transistor at the top of a memory sector and one sector selection transistor at the bottom of the sector, to reduce the series resistance. The global source lines can be connected to driver circuits or sense amplifiers. In the embodiment, within each memory sector, 104-1 or 104-2, the global source lines, GSL1, GSL2, GSL3, are connected to source terminals of the sector selection transistors, SST(1, 1) . . . SST(2,3), which are labeled as, "S," in the memory array 100 without going through the memory cells, MC(1,1, 1) . . . MC(2,2,3), of the memory sector. Consequently, voltages can be applied to the source lines without directly affecting the memory cells of the memory sector when the sector selection transistors are in the off-state.

In an embodiment, which is not shown in FIG. 1, each memory sector, 104-1 or 104-2 includes two rows of sector selection transistors, SST(1,1) . . . SST(2,3). For example, in addition to the row of sector selection transistors, SST(1,1), SST(1,2), SST(1,3), the memory sector 104-1 may include a SST row at the top of the memory sector, above the first row of memory cells, MC(1,1,1), MC(1,1,2), MC(1,1,3). Compared to a single sector selection transistor row, the two sector selection transistor row setup can reduce the series resistance caused by the sector selection devices. In some embodiments, contacts are shared between memory cells or between memory cells and the sector selection transistors to make the memory array area efficient.

In the embodiment depicted in FIG. 1, each of the 2T AND memory cells, MC(1,1,1) . . . MC(2,2,3), includes a storage transistor, S(1,1,1) . . . or, S(2,2,3), which is a non-volatile memory (NVM) element configured to store a memory value, and a corresponding access transistor, A(1,1,1) . . . or, A(2,2, 3), configured to access the storage transistor. For example, the memory cell, MC(1,1,1), includes a storage transistor, S(1,1,1), configured to store a memory value and a corresponding access transistor, A(1,1,1), configured to access the storage transistor, S(1,1,1). The storage transistors may be embodied as various different semiconductor devices such as floating gate transistors, transistors with a charge trapping nitride layer, or transistors with a nanocrystal charge trapping layer. An access transistor is also referred to as an access gate. The access transistors may be embodied as various different semiconductor selection devices, such as a bipolar transistor or a metal oxide semiconductor (MOS) transistor. Gate terminals, which are labeled with "G," of the access transistors, A(1,1,1) . . . A(2,2,3), of the memory cells, MC(1,1,1) . . .

MC(2,2,3), are connected to a corresponding word line, WL11, WL12, WL21, or WL22. For example, the word line, WL11, is connected to gate terminals, "G," of the access transistors, A(1,1,1), A(1,1,2), A(1,1,2), of the memory cells, MC(1,1,1), MC(1,1,2), MC(1,1,3). Gate terminals of the storage transistors, S(1,1,1) . . . S(2,2,3), are also referred to as control gates (CGs). In the embodiment depicted in FIG. 1, gate terminals, which are labeled with "CG," of the storage transistors, S(1,1,1) . . . S(2,2,3), of the memory cells in a memory row are connected to the corresponding voltage line, CGL11, CGL12, CGL21, or CGL22. For example, the voltage line, CGL11, is connected to gate terminals of the storage transistors, S(1,1,1), S(1,1,2), S(1,1,2), of the memory cells, MC(1,1,1), MC(1,1,2), MC(1,1,3).

An example operation of the memory array 100 is described as follows. In the example operation, a high voltage bias, such as 15V, needs to be applied to the corresponding control gate voltage line, CGL11, CGL12, CGL21, or CGL22 when data is being written to a memory row. The actual binary data written to the memory row is applied via the bit lines, BL1, BL2, BL3. Specifically, when the bit lines, BL1, BL2, BL3, are grounded, the corresponding memory cells MC(1,1) . . . MC(2,2,3) are programmed. When the bit lines, BL1, BL2, BL3, are biased to a high voltage, e.g., 6V, the corresponding memory cells MC(1,1,1) . . . MC(2,2,3) are not programmed and are in an "inhibition" status.

From a memory row point of view, the 2T AND memory array 100 includes rows of storage transistors, S(1,1,1) . . . S(2,2,3), configured to store memory values, rows of access transistors, A(1,1,1) . . . A(2,2,3), configured to control the storage transistors, and at least one row of sector selection transistors, SST(1, 1) . . . SST(2,3). The row of sector selection transistors is located adjacent to one of the rows of access transistors such that one of the rows of access transistors at an edge of the memory sector is located between the row of sector selection transistors and one of the rows of storage transistors. For example, in the memory sector 104-1, the row of access transistors A(1,2,1) . . . A(1,2,3) is located between the row of sector selection transistors SST(1,1) . . . SST(1,3) and the row of storage transistors S(1,2,1) . . . S(1,2,3). In the memory sector 104-2, the row of access transistors A(2,2,1) . . . A(2,2,3) is located between the row of sector selection transistors SST(2,1) . . . SST(2,3) and the row of storage transistors S(2,2,1) . . . S(2,2,3).

In the embodiment depicted in FIG. 1, the 2T AND memory array 100 allows column selection by applying a voltage on either a bit line, BL1, BL2, or BL3 or a global source line, GSL1, GSL, or GSL3. Because the sector selection transistors, SST(1, 1) . . . SST(2,3), are located at the access gate side of each 2T memory sector 104-1 or 104-2, the selection of memory columns during a write operation can be done directly via the bit lines, BL1, BL2, BL3. In addition, an inhibition voltage can be applied to memory columns without passing through any sector selection transistor to prevent data from being writing onto the memory columns. Consequently, the inhibition voltage is directly passed to the targeted storage transistors, independent of the SST voltage. In an embodiment, an inhibition voltage is a voltage applied at a bit line, BL1, BL2, or BL3, of an unselected memory column to prevent data from being writing onto the unselected memory column.

In a NOR flash memory array, source lines run perpendicular to bit lines. Compared to a NOR flash memory array, in the AND flash memory array 100, the global source lines, GSL1, GSL2, GSL3, run parallel to the bit lines, BL1, BL2, BL3. Because the global source lines run parallel to the bit lines, the global source lines can be biased independently from the bit lines. That is, different voltages can be applied to the global source lines and the bit lines. In addition, in the AND flash memory array 100, the same voltage can be applied to both the global source line and the bit line in the same memory column. Consequently, compared to a NOR flash memory array, in the AND flash memory array 100, a write inhibit operation can be performed without a voltage drop across a memory cell. For example, the global source line and the bit line in the same memory column can be biased at the same voltage potential during a write operation. Generally, the greater the voltage drop across the access transistors of memory cells in the off-state, the longer the physical gate length, "$L_{AG}$," of the access transistors has to be. That is, a high voltage drop across the access transistors requires relatively longer gate length. Because there can be no voltage drop across an AND memory cell during a write operation, the physical gate length, "$L_{AG}$," of the access transistors can be scaled. Consequently, memory cell size can be decreased, and read current can be reduced. Additionally, because the bit line and the source line can be biased at the same voltage potential during a write operation, the corresponding access transistor can be set to either "on" or "off" during the write operation. Consequently, the voltage applied to the gates of the access transistors can be freely chosen within a flexible voltage range, which results in a reduction of the complexity of driver circuits, a reduction in Gate Induced Drain Leakage (GIDL) in the memory array, a reduction in the load of the charge pumps, a reduction in power consumption, and a reduction in the module size. Compared to a NOR flash memory array, the AND flash memory 100 allows simpler switching, more tuning/optimization possibilities to reduce GIDL in the array, and a better gate oxide reliability.

Figure 2:
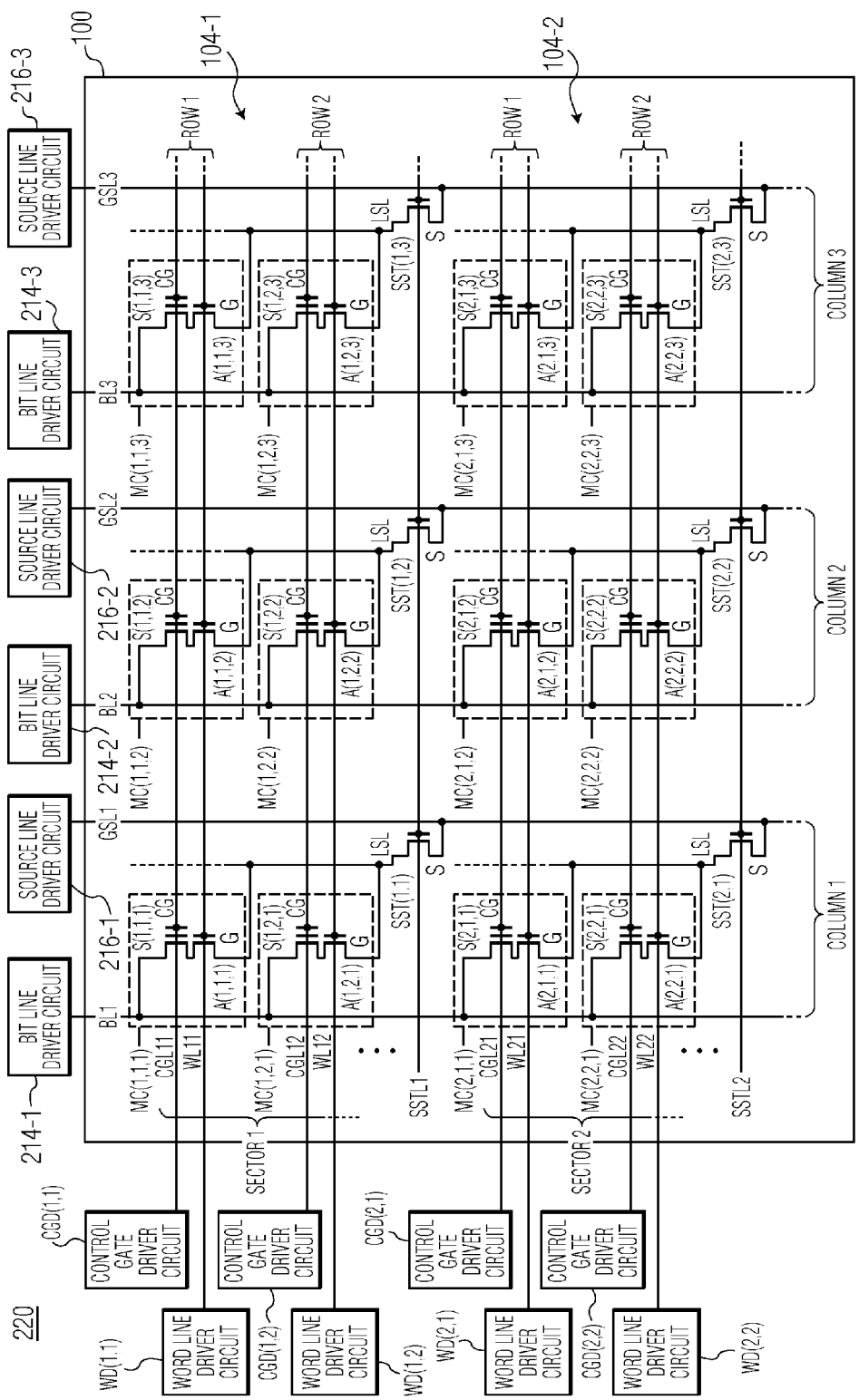
FIG. 2 depicts an embodiment of a memory architecture that includes the memory array of FIG. 1.

The memory array 100 depicted in FIG. 1 can be incorporated into a memory architecture that includes driver circuits for the word lines, WL11, WL12, WL21, WL22, the control gate voltage lines CGL11, CGL12, CGL21, CGL22, the bit lines, BL1, BL2, BL3, the global source lines, GSL1, GSL2, GSL3, and the sector selection transistors, SST(1,1) . . . SST(2,3). FIG. 2 depicts an embodiment of a memory architecture 220 that includes the memory array 100 of FIG. 1. In the embodiment depicted in FIG. 2, in addition to the memory array, the memory architecture includes word line driver circuits, WD(1,1) . . . WD(2,2), control gate driver circuits CGD(1,1) . . . CGD(2,2), bit line driver circuits, 214-1, 214-2, 214-3, and source line driver circuits, 216-1, 216-2, 216-3. Although the memory architecture is shown in FIG. 2 as including four word line driver circuits, four control gate driver circuits, three bit line driver circuits, and three source line driver circuits, typically, the memory architecture will include more word line driver circuits, control gate driver circuits, bit line driver circuits, and/or source line driver circuits. In some embodiments, the memory architecture includes one or more additional components in addition to the above-mentioned components. For example, the memory architecture may include one or more circuits for reading out information stored in the memory array, such as a row decoder and/or a column decoder, and one or more sense amplifiers, which can be voltage sense amplifiers and/or current sense amplifiers. In another example, the memory architecture includes at least one voltage supply circuit that is connected to the word line driver circuits, the bit line driver circuits, and the source line driver circuits.

The word line driver circuits, WD(1,1) . . . WD(2,2), are used to apply voltages to the corresponding rows of the memory sectors, 104-1, 104-2, of the memory array 100 through the word lines, WL11, WL12, WL21, WL22. Specifically, each of the word line driver circuits is connected to gate terminals, "G," of the access transistors of the memory cells in the corresponding row through a word line. The control gate driver circuits, CGD(1,1) ... CGD(2,2), are used to apply voltage to the control gates, "CG," of the corresponding storage transistors, S(1,2,1) ... S(1,2,3), through the control gate voltage lines, CGL11, CGL12, CGL21, CGL22. The bit line driver circuits, 214-1, 214-2, 214-3, are used to apply voltages to the memory cells, MC(1,1,1) ... MC(2,2,3), via the storage transistors, S(1,1,1) ... S(2,2,3), through the bit lines, BL1, BL2, BL3. Each of the bit line driver circuits can be used to access one memory cell in each row of the memory array. The source line driver circuits are used to apply voltages to source terminals, which are labeled as, "S," of the sector selection transistors, SST(1, 1) ... SST(2,3), in the memory array.

Figure 3:
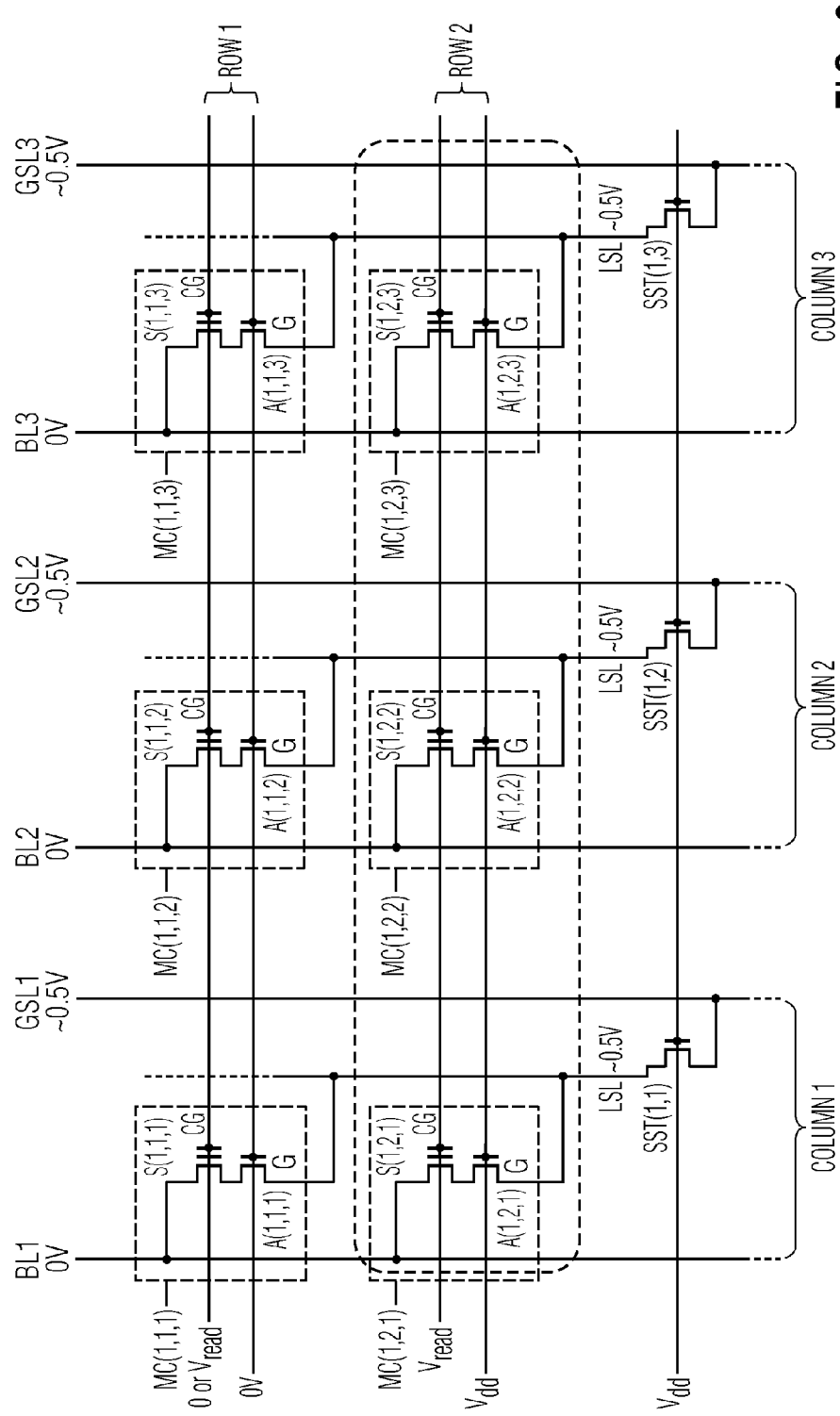
FIG. 3 depicts exemplary voltages that are applied to a memory sector of the memory array depicted in FIG. 1, during a read operation.
Figure 4:
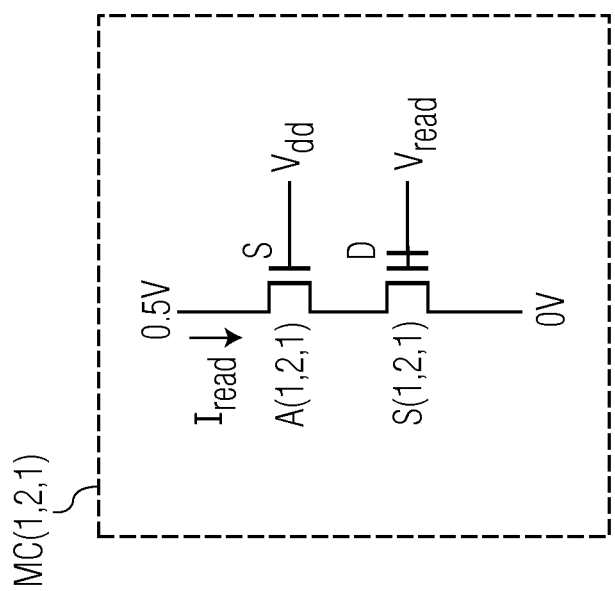
FIG. 4 depicts a current flow in a memory cell of the memory array depicted in FIG. 1, during the read operation of FIG. 3.
Figure 5:
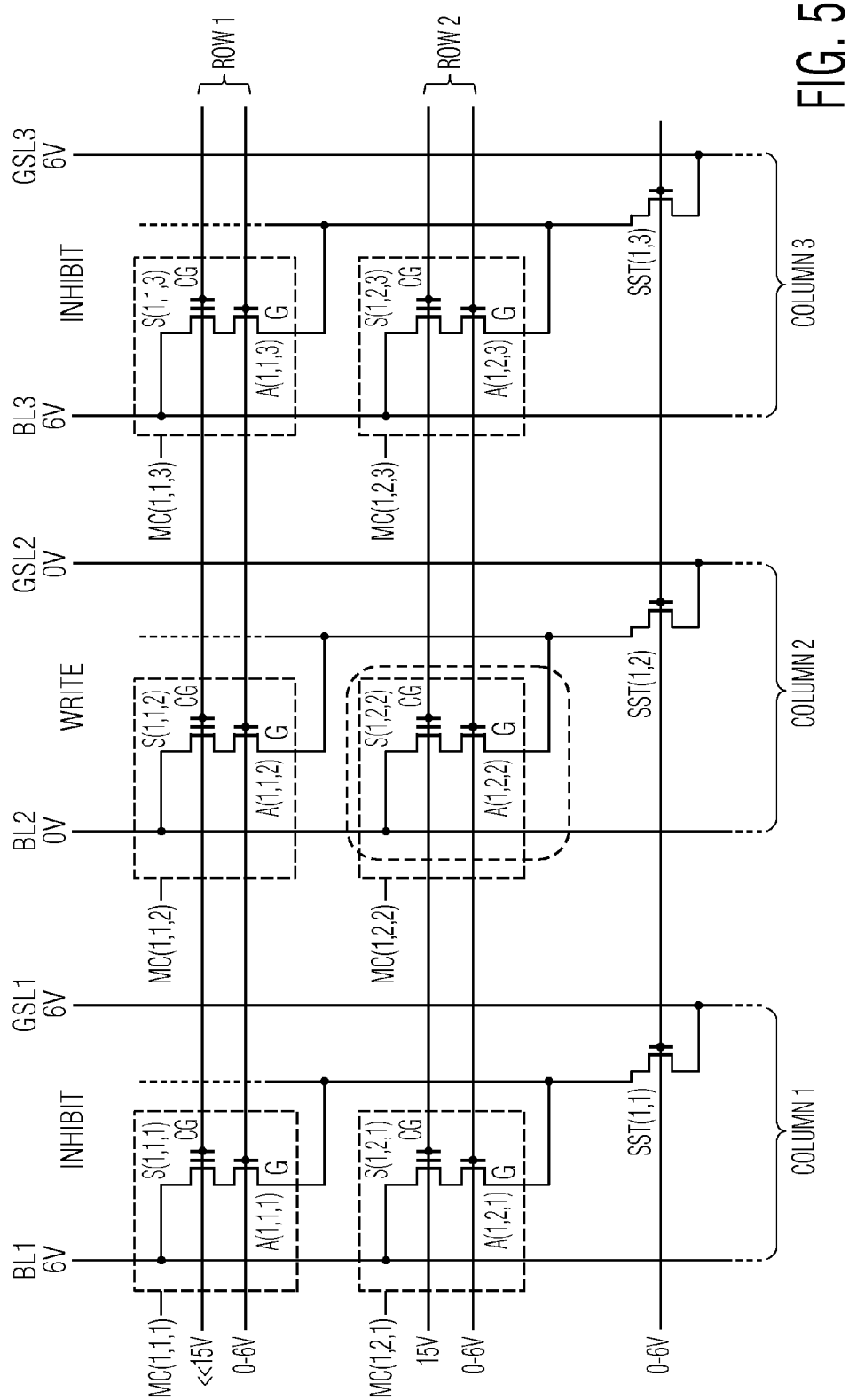
FIG. 5 depicts exemplary voltages that are applied to a memory sector of the memory array depicted in FIG. 1, during a write operation.

Examples of read and write operations of the memory array 100 depicted in FIG. 1 are described with references to FIGS. 3-5. Specifically, FIG. 3 depicts exemplary read voltages that are applied to a memory sector of the memory array depicted in FIG. 1, during a read operation. During the read operation, a memory column is selected via one of the global source lines, GSL1, GSL2, GSL3, and a corresponding one of the sector selection transistors, SST(1,1) ... SST(2,3). In the embodiment depicted in FIG. 3, a second memory row of the memory sectors 104-1, which contains memory cells, MC(1,2,1), MC(1,2,2), MC(1,2,3), is selected by applying a read voltage, "$V_{read}$," to the gate terminals of the storage transistors, S(1,2,1), S(1,2,2), S(1,2,3), and applying a selected voltage, "$V_{dd}$," to the gate terminals of the access transistors, A(1,2,1), A(1,2,2), A(1,2,3), and the sector selection transistors, SST(1,1), SST(1,2), SST(1, 3). During the read operation, the bit lines, BL1, BL2, BL3, are kept at ground potential (or 0V), while a voltage of around 0.5V is applied to the global source lines, GSL1, GSL2, GSL3. The voltage at the local source lines is around 0.5V. Although some examples of the applied voltages are described, the actual applied voltages can be different from the ones mentioned in these examples.

FIG. 4 depicts a current flow in a memory cell MC(1,2,1) of the memory array 100 depicted in FIG. 1 that is being read during the read operation of FIG. 3. As shown in FIG. 4, the current, "$I_{read}$," flow in a selected 2T memory cell during the read operation is from the source terminal, "S," of the access transistor A(1,2,1) to the drain terminal, "D," of the access transistor. Compared to an NOR memory cell in which the current flows from a storage transistor to an access transistor, the voltage, "$V_{dd}$," applied to the access transistor A(1,2,1) needs to be maintained in a sufficiently high level.

FIG. 5 depicts exemplary write voltages that are applied to memory sector 104-1 of the memory array 100 depicted in FIG. 1, during a write operation. During the write operation, voltages applied to the sector selection transistors, SST(1,1), SST(1,2), SST(1,3), and the access transistors, A(1,1,1) ... A(1,2,3), can be set to values that are within a flexible range of voltages. For example, voltages applied to the sector selection transistors and the access transistors can be set to 0-6V during programming. Voltages applied to the sector selection transistors and the access transistors can be optimized and fine-tuned, based on different factors. For example, to minimize the stress on the gate oxides of the memory cells, MC(1,1,1) ... MC(2,2,3), voltages applied to the sector selection transistors and the access transistors can be set to around the middle of the applicable voltage range such as 3V. In some embodiments, to reduce Gate Induced Drain Leakage (GIDL) in the memory array, the sector selection transistors and the access transistors are biased at the inhibition voltage, such as around 6V.

In the embodiment depicted in FIG. 5, a memory cell, MC(1,2,2), is selected by applying a voltage of around zero to the bit line, BL2, and the global source line, GSL2, and applying a write voltage of around 15V to the storage transistor, S(1,2,2). For the unselected columns of memory cells, an inhibition voltage of around 6V is applied to the bit lines, BL1, BL3, such that writing data to the memory cells other than the memory cell, MC(1,2,2), in the memory sector 104-1 is prevented during the write operation. Because the sector selection transistors, SST(1,1), SST(1,2), SST(1,3), are located adjacent to the access transistors, A(1,2,1), A(1,2,2), A(1,2,3), of the memory sector 104-1, the selection of memory columns during the write operation can be done directly via a corresponding bit line without passing through any sector selection transistor. During the write operation, a voltage of around 6V is applied to the global source lines, GSL1, GSL3. A voltage of lower than 15V is applied to the gate terminals of the access transistors, A(1,1,1), A(1,1,2), A(1,1,3), in the unselected memory row. A voltage between zero and 6V is applied to the storage transistors, S(1,1,1) ... S(1,2,3), and the sector selection transistors, SST(1,1), SST(1,2), SST(1, 3). Although some examples of the applied voltages are described, the actual applied voltages can be different from the ones mentioned in these examples. For example, although positive voltages are described, in some embodiments, the applied voltages are realized by a combination of positive voltages and negative voltages.

Although specific embodiments of the invention that have been described or depicted include several components described or depicted herein, other embodiments of the invention may include fewer or more components to implement less or more feature.

In addition, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A flash memory array comprising:
  a plurality of memory sectors of Two-Transistor (2T) AND memory cells, wherein within each of the memory sectors, a row of sector selection transistors is configured such that writing data onto a memory column within the memory sector is controlled by applying a voltage to a bit line, independent from the row of sector selection transistors.

2. The flash memory array of claim 1, wherein each of the memory sectors further includes:
  a plurality of rows of storage transistors configured to store memory values; and
  a plurality of rows of access transistors configured to access the rows of storage transistors,
  wherein the row of sector selection transistors is used to select the rows of access transistors and the rows of storage transistors.

3. The flash memory array of claim 2, wherein each 2T AND memory cell comprises:
  a storage transistor in the rows of storage transistors configured to store a memory value; and
  an access transistor in the rows of access transistors configured to access the storage transistor.

4. The flash memory array of claim 2, wherein within each of the memory sectors, the row of sector selection transistors is located adjacent to the one of the rows of access transistors such that the one of the rows of access transistors is located between the row of sector selection transistors and one of the rows of storage transistors.

5. A smart card comprising the flash memory array of claim 1.

6. The flash memory array of claim 1, wherein each of the memory sectors includes a first row of sector selection transistors at top of the memory sector and a second row of sector selection transistors at bottom of the memory sector.

7. A computing device comprising the flash memory array of claim 1.

8. The computing device of claim 7, wherein the computing device is a smartphone or a tablet computer.

9. A Two-Transistor (2T) AND flash memory array comprising:
- a plurality of rows of storage transistors configured to store memory values;
- a plurality of rows of access transistors configured to access the rows of storage transistors; and
- a row of sector selection transistors used to select the rows of access transistors and the rows of storage transistors, wherein the row of sector selection transistors is located adjacent to the one of the rows of access transistors such that the one of the rows of access transistors is located between the row of sector selection transistors and one of the rows of storage transistors.

10. The 2T AND flash memory array of claim 9, wherein the rows of storage transistors and the rows of access transistors are grouped into a plurality of memory sectors of 2T AND memory cells, and wherein each 2T AND memory cell comprises a storage transistor in the rows of storage transistors configured to store a memory value and an access transistor in the rows of access transistors configured to access the storage transistor.

11. The 2T AND flash memory array of claim 10, wherein within each of the memory sectors, a respective row of sector selection transistors is located adjacent to access transistors of a row of 2T AND memory cells of the memory sector such that the access transistors of the row of 2T AND memory cells are located between the respective row of sector selection transistors and a row of storage transistors.

12. The 2T AND flash memory array of claim 10, wherein each of the memory sectors includes a first row of sector selection transistors at top of the memory sector and a second row of sector selection transistors at bottom of the memory sector.

13. A computing device comprising the 2T AND flash memory array of claim 9.

14. The computing device of claim 13, wherein the computing device is a smartphone or a tablet computer.

15. A smart card comprising the 2T AND flash memory array of claim 9.

16. A flash memory array comprising:
- a plurality of memory sectors of Two-Transistor (2T) AND memory cells, wherein each of the memory sectors comprises a plurality of memory rows of 2T AND memory cells and a row of sector selection transistors connected to the memory rows and used to select the memory rows, wherein each of the memory rows comprises a plurality of 2T AND memory cells, and wherein each 2T AND memory cell comprises:
- a storage transistor configured to store a memory value; and
- an access transistor configured to access the storage transistor,
wherein within each of the memory sectors, a respective row of sector selection transistors is located adjacent to the access transistors of a row of 2T AND memory cells of the memory sector such that the access transistors of the row of 2T AND memory cells are located between the respective row of sector selection transistors and a row of storage transistors.

17. The flash memory array of claim 16, wherein within each of the memory sectors, bit lines are connected to storage transistors and source lines are connected to the row of sector selection transistors.

18. The flash memory array of claim 17, wherein within each of the memory sectors, the source lines are connected to source terminals of the row of sector selection transistors without going through the 2T AND memory cells of the memory sector.

19. The flash memory array of claim 16, wherein each of the memory sectors includes a first row of sector selection transistors at top of the memory sector and a second row of sector selection transistors at bottom of the memory sector.

20. A computing device comprising the flash memory array of claim 16, wherein the computing device is a smartphone or a tablet computer.

* * * * *